US010487513B2

(12) United States Patent
Hieke et al.

(10) Patent No.: US 10,487,513 B2
(45) Date of Patent: Nov. 26, 2019

(54) MULTI-LAYERED VENTILATION APPARATUS AND METHODS OF MANUFACTURING THEREOF

(71) Applicant: William Boone Daniels, Sebastopol, CA (US)

(72) Inventors: Andreas Hieke, San Mateo, CA (US); William Boone Daniels, II, Honolulu, HI (US)

( * ) Notice: Subject to any disclaimer, the term of this patent is extended or adjusted under 35 U.S.C. 154(b) by 102 days.

(21) Appl. No.: 14/717,794

(22) Filed: May 20, 2015

(65) Prior Publication Data
US 2015/0337536 A1 Nov. 26, 2015

Related U.S. Application Data

(60) Provisional application No. 62/001,991, filed on May 22, 2014.

(51) Int. Cl.
| | | |
|---|---|---|
| *E04D 13/17* | (2006.01) | |
| *E04D 1/28* | (2006.01) | |
| *C23C 16/50* | (2006.01) | |
| *C23C 14/22* | (2006.01) | |
| *C23C 4/12* | (2016.01) | |

(Continued)

(52) U.S. Cl.
CPC .............. *E04D 13/178* (2013.01); *B05B 3/02* (2013.01); *B05C 3/02* (2013.01); *C23C 4/12* (2013.01); *C23C 14/00* (2013.01); *C23C 14/22* (2013.01); *C23C 16/00* (2013.01); *C23C 16/50* (2013.01); *E04D 1/28* (2013.01); *E04D 1/30* (2013.01);
(Continued)

(58) Field of Classification Search
CPC ......... E04D 13/178; E04D 13/17; E04D 1/28; E04D 1/30; B05B 3/02; B05C 3/02; C23C 4/12; C23C 14/00; C23C 14/22; C23C 16/00; C23C 16/50; F24F 7/02
USPC ........................................ 454/365, 366, 367
See application file for complete search history.

(56) References Cited

U.S. PATENT DOCUMENTS 5,738,581 A * 4/1998 Rickert .................. E04D 13/176
454/365
6,050,039 A * 4/2000 O'Hagin .................... E04D 1/30
454/242

(Continued)

FOREIGN PATENT DOCUMENTS

EP 0980498 12/2004

OTHER PUBLICATIONS

Ferraro et al., Superhydrophobic What? How Rust-Oleum NeverWet Works, Jan. 9, 2014, https://www.livescience.com/42461-how-neverwet-coating-works.html.*

(Continued)

*Primary Examiner* — Gregory L Huson
*Assistant Examiner* — Dana K Tighe
(74) *Attorney, Agent, or Firm* — Knobbe, Martens, Olson & Bear, LLP

(57) ABSTRACT

Disclosed is an apparatus for venting buildings, specifically attic spaces, such vents being predominantly shape-conform to the components from which a wall or a roof is built (typically tiles, in the context of roofs), the vent typically being fabricated from a metallic, plastic, or ceramic core as well as one or more layers from other materials or compounds which modify the overall characteristics of the vent, such as the surface characteristics. Furthermore disclosed are methods of manufacturing such ventilation apparatuses.

80 Claims, 5 Drawing Sheets

(51) Int. Cl.
*B05C 3/02* (2006.01)
*B05B 3/02* (2006.01)
*C23C 14/00* (2006.01)
*C23C 16/00* (2006.01)
*E04D 1/30* (2006.01)
*F24F 7/02* (2006.01)

(52) U.S. Cl.
CPC ............... *E04D 13/17* (2013.01); *F24F 7/02* (2013.01); *E04D 2001/309* (2013.01)

(56) References Cited

U.S. PATENT DOCUMENTS

| | | | |
|---|---|---|---|
| D458,392 S | 6/2002 | O'Hagin et al. | |
| 6,447,390 B1 | 9/2002 | O'Hagin | |
| 6,491,579 B1* | 12/2002 | O'Hagin | E04D 1/30 |
| | | | 454/250 |
| 7,424,790 B2* | 9/2008 | Austin | E04D 13/004 |
| | | | 52/94 |
| 7,604,536 B2* | 10/2009 | Coulton | E04D 13/176 |
| | | | 454/365 |
| 7,901,278 B2* | 3/2011 | O'Hagin | E04D 1/30 |
| | | | 454/365 |
| 8,728,609 B2* | 5/2014 | Torres | E04D 1/08 |
| | | | 428/157 |
| 2008/0098674 A1* | 5/2008 | Daniels | E04D 1/045 |
| | | | 52/199 |
| 2008/0107864 A1* | 5/2008 | Zhang | C04B 41/009 |
| | | | 428/141 |
| 2008/0299892 A1* | 12/2008 | Robinson | E04D 1/30 |
| | | | 454/366 |
| 2013/0019548 A1 | 1/2013 | Daniels | |
| 2013/0217318 A1* | 8/2013 | Edwards | E04D 1/24 |
| | | | 454/366 |

OTHER PUBLICATIONS

Cossins, 'Hydrophobic' NeverWet spray makes your phone waterproof, May 10, 2012, http://www.wired.co.uk/article/now-your-phone-can-swim.*

* cited by examiner ns and methods of manufacturing thereof

BACKGROUND OF THE INVENTION

Field of the Invention

The invention relates to ventilation of buildings, and more precisely to predominantly shape-conform roof vents with enhanced properties.

Description of the Related Art

The proper ventilation of buildings and houses is important to maintain suitable humidity levels, to help maintain acceptable temperature inside the building while reducing costs for heating or cooling, and for maintaining indoor air quality.

In some cases such ventilation systems comprise ducts through which air from the inside of a building is channeled towards the roof. In other cases the ventilation systems primarily serve to ventilate the attic spaces of a building. In some instances these may be passive ventilation systems and in other instances active systems, such as active ventilation systems driven by a fan.

In many such cases vents are needed which are typically placed on the roof or sometimes on the walls of buildings. The principle function of the vent is to enable air inflow or outflow while reducing, or in some cases, effectively eliminating penetration of water (rain, snow, ice), debris, vermin, insects, embers, or other unwanted material into the building.

Sometimes, vents are integrated into the roof or wall in a shape-conform manner in order to reduce the disturbance to the optical appearance of the roof or wall. In case of vents which are placed on the roof of a building, the vents may be shaped, colored, and surface-structured like clay or concrete tiles and are then often referred to as vent tile or ventilation roof tile.

For example, Harry O'Hagin describes in U.S. Pat. No. 6,447,390 B1 a "Method and Apparatus for Roof Ventilation," which entails various styles of roof vents which are "generally conforming to and are adapted to be mounted . . . among a plurality of roof tiles". Furthermore, Harry O'Hagin and Carolina O'Hagin describe in U.S. Pat. No. D458,392 S a "tile roof with a cloaked roof vent". Similarly, Harry O'Hagin describes in EP 0 980 498 B1 an attic vent which attempts to match the surrounding tilted tile roofs appearance and wherein the "vent skeleton being formed of a single piece of material".

Such conventional vents are typically made from a single material, like metal, such as sheet metal, or in some cases, steel, or in some cases aluminum, copper, or other metals, or a single alloy thereof. While these materials allow the manufacture of such vents in a cost effective manner, the physical and chemical properties of the vent are limited to the material properties of the single material, such as sheet metal, of which they are made.

Therefore, there is a mismatch between said physical and chemical properties and those of the actual roof or wall, which is typically manufactured from concrete, clay, ceramics, or wood. Furthermore, certain levels of physical and chemical properties can simply not be reached with a ventilation roof tile solely manufactured from sheet metal.

Hence there is need for a way to tailor the properties of vents in such a way that additional, overall properties can be achieved which may not be achieved with vents that are predominantly a single metallic, plastic, or ceramic material. Multi-layered, multi-functional systems can provide such capabilities.

SUMMARY OF THE INVENTION

For purposes of summarizing the invention and the advantages achieved over the prior art, certain objects and advantages of the invention have been described herein. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

The principle of the invention is to provide vents, such as shape-conform vents, which include a metallic, plastic, or ceramic core, as well as one, two, or more additional layers including other materials or compounds, which modify the overall characteristics of the vent, such as the surface characteristics. The metallic, plastic, or ceramic core can provide shape and mechanical stability, whereas the additional layers can enable additional beneficial effects.

In some embodiments the core material of the vent, such as a shape-conform vent, is modified at the surface in such a way that effectively a multi-layered material is produced. In some embodiments the disclosed multi-layered shape-conform vent also serves at least in part to protect at least to some degree at least one underlaying element from detrimental environmental influences. In some such embodiments this can serve to extend the lifetime of said at least one underlying element.

The method of manufacturing the core itself may differ, depending on the material used. For example, sheet-metal may be cut, bent and welded or riveted, whereas a plastic core may for example be produced by a hot deforming process or by injection molding, or other processes. A ceramic core may, for example be produced by a sinter-like process or by injecting wet clay in a suitable form, or other processes, possibly in two or more steps.

Figure 1:
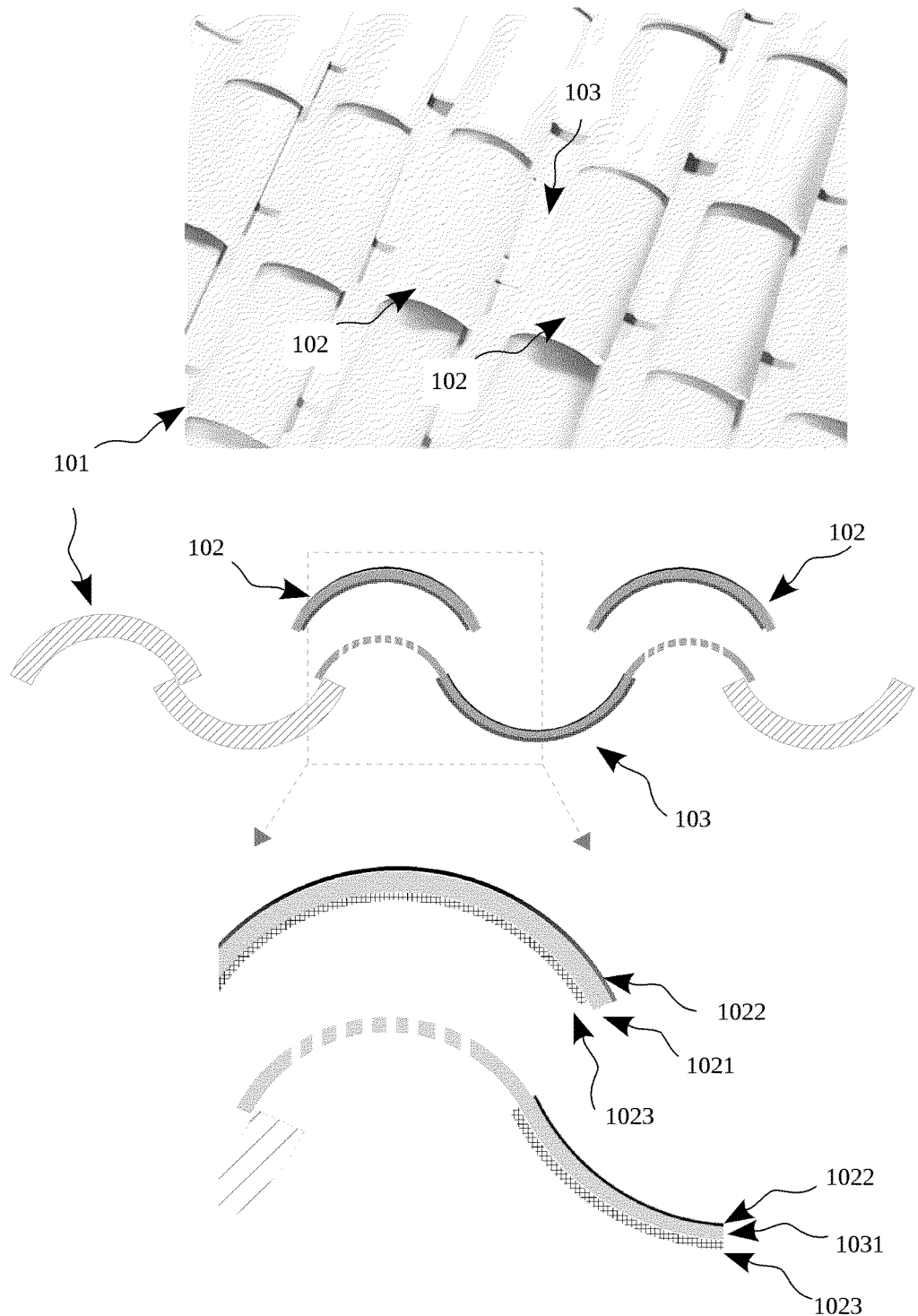
FIG. 1 illustrates schematically an embodiment of the disclosed invention, as applied to an M-style clay tile roof. At the top of FIG. 1, a 3-D view of a section of a roof, including a plurality of tiles 101, is shown. At the center of this section is a predominantly shaped conform vent shown, the visible part of which comprises two convex outer elements 102 and one concave element 103. At the center of FIG. 1 a horizontal cross-section through this roof section including the predominantly shaped conform vent is shown, schematically illustrating this embodiment of a roof vent. As can be seen in the enlargement of this cross section at the bottom of FIG. 1, the elements 102 and 103 comprise actual core structures 1021 and 1031, onto which two additional layers 1022 and 1023 have been added. For example, layer 1022 may be predominantly hydrophobic or super-hydrophobic, and layer 1023 may for example serve to improve the thermal insulation of the vent.
Figure 2:
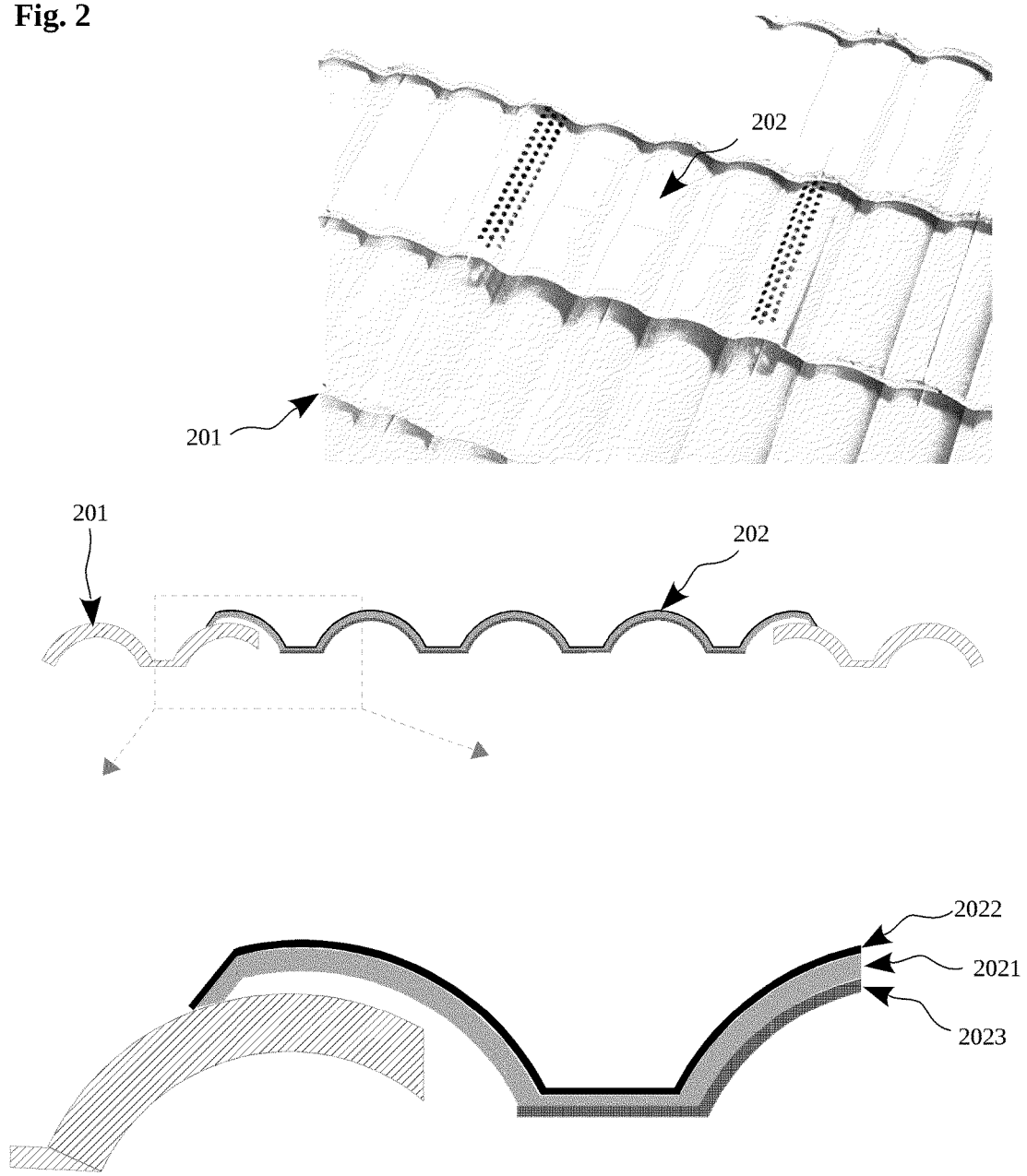
FIG. 2 illustrates schematically an embodiment of the disclosed invention employed within an M-shaped concrete tile roof. In some embodiments of such roofs a single concrete tile can resemble two or more conventional tiles. At the top of FIG. 2 a 3-D view a section of a roof, including a plurality of tiles 201, is shown. At the center of this section is a predominantly shaped conform vent shown, the visible part of which comprises an outer element 202, sometimes referred to as "outer vent cover," which has typically two or three, or more cylindrical and convex sections. There can also be one or more inner elements, sometimes referred to as "subflashing" or "primary vent cover" and which are not shown in FIG. 2. At the center of FIG. 2 a cross section through this roof section including the predominantly shaped conform vent is shown, schematically illustrating this embodiment of a roof vent. (In this case the cross section is taken at a location where no orifices in element 202 can be seen, though which air flow occurs.) As can be seen in the enlargement of this cross section at the bottom of FIG. 2, the element 202 comprises the actual core structures 2021, onto which two additional layers 2022 and 2023 have been added. For example, layer 2022 may be predominantly hydrophobic or super-hydrophobic, and layer 2023 may for example serve to improve the thermal insulation of the vent.
Figure 3:
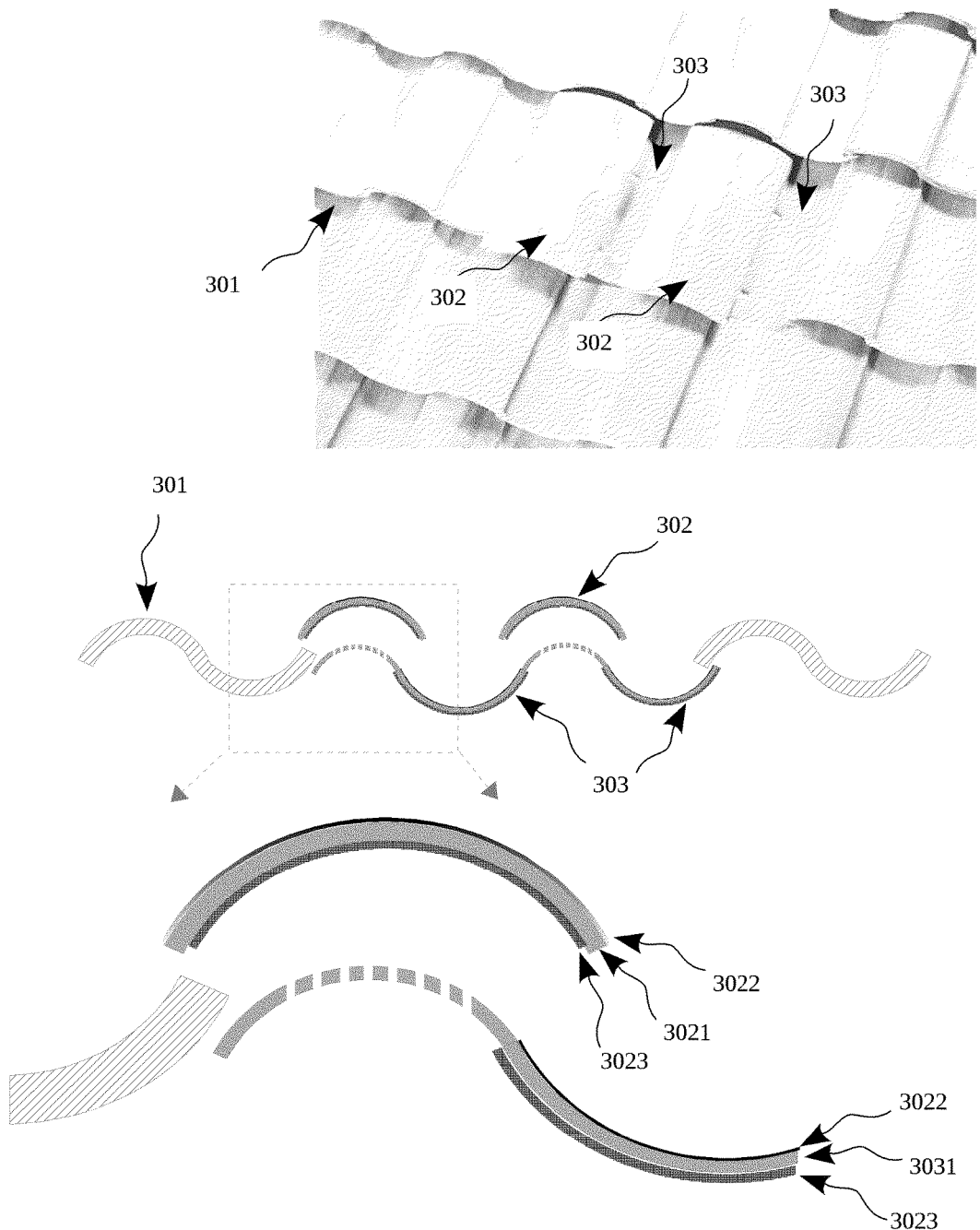
FIG. 3 illustrates schematically an embodiment of the disclosed invention employed within a S-shaped concrete tile roof. Typically a single tile has the cross section resembling an "S," for example, the geometric shape is formed by two parallel, inverted cylinder wall sections, but in some cases the tile comprises one convex cylinder wall section and one predominantly flat section. At the top of FIG. 3 a 3-D view a section of a roof, including a plurality of tiles 301, is shown. At the center of this section is a predominantly shaped conform vent shown, the visible part of which, sometimes referred to as "outer vent cover," comprises two predominantly cylindrically convex elements 302 and two predominantly cylindrically concave elements 303. There can also be one or more inner elements, sometimes referred to as "subflashing" or "primary vent cover," and which are not shown in FIG. 3. At the center of FIG. 3 a cross section through this roof section including the predominantly shaped conform vent is shown, schematically illustrating this embodiment of a roof vent. As can be better seen in the enlargement of this cross section at the bottom of FIG. 3, the element 302 comprises the actual core structures 3021, onto which two additional layers 3022 and 3023 have been added. The same layers 3022 and 3023 have been added to the cores of the convex elements 3031. For example, layer 3022 may be predominantly hydrophobic or super-hydrophobic, and layer 3023 may for example serve to improve the thermal insulation of the vent.
Figure 4:
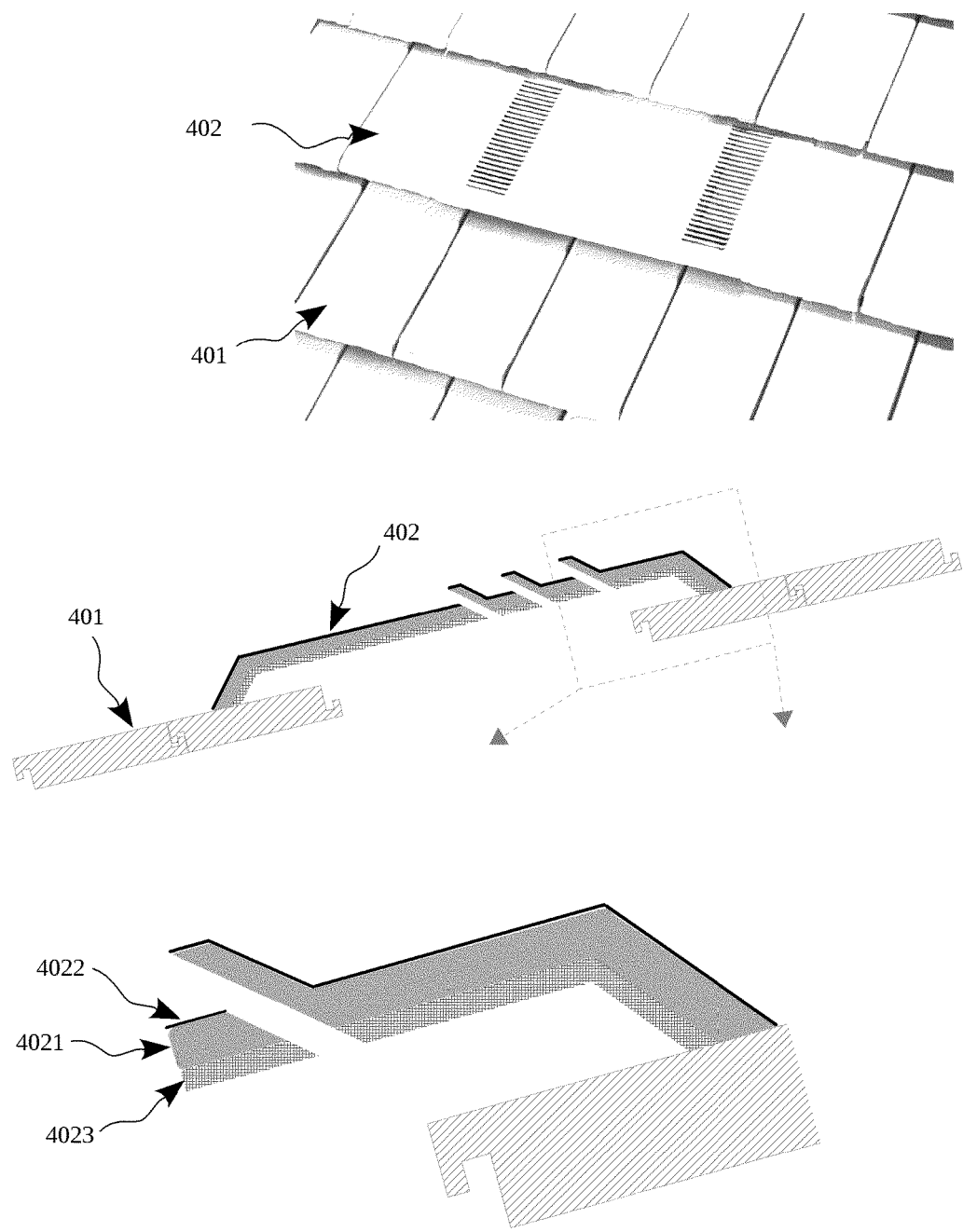
FIG. 4 illustrates schematically an embodiment of the disclosed invention employed within a flat clay tile roof. At the top of FIG. 4 a 3-D view a section of a roof, including a plurality of tiles 401 is shown. At the center of this section is a predominantly shaped conform vent shown, the visible part of which comprises a predominantly flat outer element 402, sometimes referred to as "outer vent cover as well as one or more inner elements, sometimes referred to as "subflashing" or "primary vent cover," and which are not shown in FIG. 4. At the center of FIG. 4 a cross section through this roof section including the predominantly flat vent is shown, schematically illustrating this embodiment of a roof vent. As can be better seen in the enlargement of this cross section at the bottom of FIG. 4, the element 402 comprises the actual core structure 4021, onto which two additional layers 4022 and 4023 have been added. For example, layer 4022 may be predominantly hydrophobic or super-hydrophobic, and layer 4023 may for example serve to improve the thermal insulation of the vent.
Figure 5:
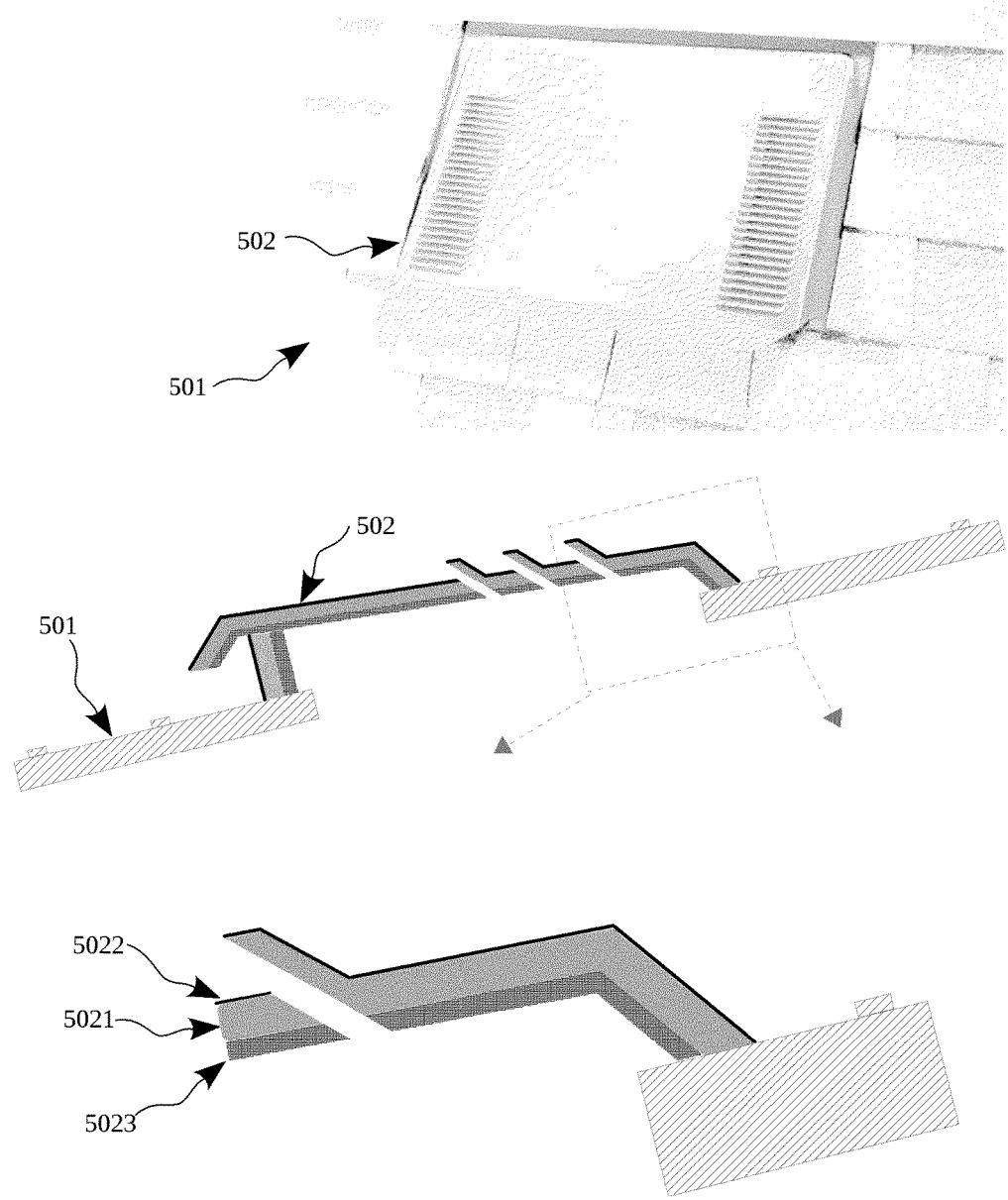
FIG. 5 illustrates schematically an embodiment of the disclosed invention employed within shingle, or slate & shake roofs. At the top of FIG. 5 a 3D view a section of a roof, including a plurality of shingles 501 or larger predominantly flat plates, which are structures such as to resemble shingles. At the center of this section is a predominantly shaped conform vent shown, the visible part of which comprises a predominantly flat outer element 502, sometimes referred to as "outer vent cover".

The appearance is similar to the vent shown in FIG. 4. There are also invisible inner elements, sometimes referred to as "subflashing" or "primary vent cover," and which are not shown in FIG. 5. At the center of FIG. 5 a cross section through this roof section including the predominantly flat vent is shown, schematically illustrating this embodiment of a roof vent. As can be better seen in the enlargement of this cross section at the bottom of FIG. 5, the element 502 comprises the actual core structure 5021, onto which two additional layers 5022 and 5023 have been added. For example, layer 5022 may be predominantly hydrophobic or super-hydrophobic, and layer 5023 may for example serve to improve the thermal insulation of the vent.

DETAILED DESCRIPTION

Roof vents are typically made from sheet metal and in certain cases shaped like tiles from which the entire roof is made, i.e., shape-conform thereby visually blending into the roof. In some embodiments these may be mission style, or S-style, or Villa-style, or so-called Japanese-style vent tiles. In some embodiments these may be flat tiles vents in order to match very smooth and flat roofs. The vent contains gaps which are located in such a way that a visual disturbance can be reduced, air flow can be increased, and penetration of water into the house can be reduced, or even essentially eliminated.

According to the disclosed invention such shape-conform vents can be made not only of said sheet metal, plastic, or ceramic but comprise at least one additional layer which changes some of the chemical of physical properties of the vent. In some embodiments one or more additional layers may be employed either above or below the metallic, plastic, or ceramic core. Furthermore, in an embodiment the disclosed predominantly shape-conform multi-layered vents have a size which is an integer multiple of the size of the actual roof tiles.

Various methods of producing multilayer materials can be used, which according to the present invention are used to fabricate shape-conform multi-layered ventilation apparatuses. Several properties of the vent can thereby be enhanced.

Types of Layers

In one embodiment of the disclosed invention at least a single additional layer is used to change the behavior of the surface of the ventilation apparatus with respect to water, which can have one or more beneficial effects. In one embodiment a hydrophobic layer (contact angle typically larger than 90°), or even a super-hydrophobic layer (contact angle typically larger than 150°) is applied to the surface of the shape-conform vent. Such a layer will reject water and thus reduce the tendency of the vent to accumulate dirt, to corrode, or to leak. Also, on super-hydrophobic surfaces small water droplets are formed on top of the surface, hardly touching instead of wetting the surface, and these droplets are removed by even very slow air movements, in fact collecting and removing other dust and dirt particles in the process.

In an embodiment, the hydrophobic layer is applied to the sheet metal prior to forming the actual ventilation apparatus from it. In another embodiment the hydrophobic layer is applied to ventilation apparatus after it has been built from sheet metal. In yet another embodiment the hydrophobic layer is applied previously fabricated and already installed roof vents which are predominantly made from one material. In particular, kits may be provided to both contractors and end users which permit to apply such a hydrophobic or super-hydrophobic layer to already installed predominantly shape-conform vents. In some embodiments such a coating has to be reapplied by the contractor or end user after a certain time in order to sustain a certain level of effectiveness.

In some embodiments the hydrophobic layer may be created by polymers, incl. polyurethane (PU), acrylates, silicones, PVC, plastisols, i.e., a dispersion of PVC resins in a plasticiser. Examples are given later. In some such embodiments the plasticiser may be a phthalate, including for example dioctyl phthalate, ditridecyl phthalate, or diisodecyl phthalate.

In some embodiments the hydrophobic layer may be transparent and in other embodiments also serve to achieve a specific color of the vent.

In some embodiments, super-hydrophobic, or self-cleaning, layers may be applied or the surface of the predominantly shape-conform vent, or the surface of the vent may be modified by a suitable process in such a way that nanostructures are created on said surface, thereby obtaining a super-hydrophobic effect. In some embodiments the hydrophobic or super-hydrophobic effect may be created by a combination of applying additional material and a process to physically or chemically modify the surface.

In some embodiments these nanoparticles may be naturally occurring or may be synthesized.

In some embodiments the hydrophobic layer may be based on titania or silica particles and applied by a sol-gel process.

In some embodiments one or more of the additional layers may contain nanoparticles. In some embodiments the layer or layers are based on pure zinc oxide (ZnO) nanoparticles, zinc oxide polystyrene (ZnO/PS) nanocomposites, precipitated calcium carbonate, carbon nanotubes, manganese oxide polystyrene ($MnO_2$/PS) nanocomposite, silica nanoparticles, aluminosilicate nanoparticles, titanium dioxide $TiO_2$ nanoparticles, silicon dioxide $SiO_2$ nanoparticles, or other suitable nanoparticles or mixtures thereof. In some special embodiments a super-hydrophobic layer may be based on metal matrix composites. In some embodiments the one or more additional layers may contain metallic nanoparticles embedded in a ceramic matrix. In other embodiments the one or more additional layers may contain nanoparticles embedded in poly(dimethylsiloxane) (PDMS). Additional examples are given below.

In some embodiments silica-based gel films may be modified with a fluorinated silane. In some embodiments layers may be produced by coating the surface with long-chain alkanoic acids.

In some embodiments one or more of the additional layers may contain calcium carbonate $CaCO_3$ nanoparticles (optionally additionally chemically modified) and embedded in a binder, typically an acrylate polymer, resulting in a hydrophobic or super-hydrophobic effect.

In some embodiments one or more of the additional hydrophobic or super-hydrophobic layers on the predominantly shape-conform vent core may be produced by a nanostructured composites formed from particle-polymer dispersions.

In some embodiments one or more of the additional hydrophobic oder super-hydrophobic layers on the predominantly shape-conform vent core may be formed by a composite of a polyurethane matrix and nanoparticles from silicate type minerals, specifically phyllosilicate type minerals, and more specifically in some embodiments nanoparticles from Montmorillonite, Vermiculite, Kaolinite, Palygorskite or Pyrophyllite. Such materials can under certain conditions form hierarchical nano- and micro-scale topology, which results in string hydrophobicity. In addition, these nanoparticles may be chemically modified by the use of aminosilanes, e.g. (3-Aminopropyl)triethoxysilane, and polyamines (e.g. octadecylamine). The polyurethane matrix may be formed by using a moisture-curable polyurethane formula including a smaller component of methylene diphenyl diisocyanate (MDI) and a larger portion of polyurethane pre-polymer.

In some embodiments one or more of the additional hydrophobic oder super-hydrophobic layers on the predominantly shape-conform vent core may be formed by aluminum oxide $Al_2O_3$ nanoparticles suspended in a silicone rubber matrix. Such a layer may be created by first ultrasonically cleaning the vent core (for example in acetone), and then applying a solution of aluminum oxide nanoparticles, solvent (e.g. acetone), and silicone rubber. In some embodiments the nanoparticles mat be embedded in room temperature vulcanizing (RTV) silicone rubber.

In some embodiments one or more of the additional hydrophobic oder super-hydrophobic layers on the predominantly shape-conform vent core may be comprise an elastomeric nanostructured composite formed from by applying (e.g. spaying) nanostructured carbon black particles (or other carbon nanoparticles) as well as submicrometer-sized poly(tetrafluoroethylene) particles both dispersed in a nitrile rubber solution in acetone.

In some embodiments an additional layer may be added to the predominantly shape-conform roof vent, which comprises a synthetic fluoropolymer, specifically polytetrafluoroethylene (PTFE). In some embodiments film a hydrophobic or super-hydrophobic layer is produced by first depositing nanoparticles on the vent core and in a second step overcoating these nanoparticles by a layer of plasma sputtered PTFE.

In some embodiments an additional hydrophobic or super-hydrophobic layer may be added to the predominantly shape-conform vent core by applying a suspension of a mixture of titanium dioxide $TiO_2$ nanoparticles and zinc oxide ZnO nanoparticles in perfluoroalkylacrylate (PAA).

In some embodiments an additional hydrophobic or super-hydrophobic layer may be added to the predominantly shape-conform vent core by applying a suspension of titanium dioxide $TiO_2$ nanowires in tetrahydrofuran (THF) and poly(dimethylsiloxane)(PDMS).

In some special embodiments the vent may predominantly be fabricated from a multi-functional composite material. For example, since super-hydrophobic layers can be susceptible to wear, in some embodiments the super-hydrophobic component is actually embedded in the core material of the predominantly shape-conform vent, thereby forming effectively a multi-functional composite material.

Similarly, in some embodiments the surface of the predominantly shape-conform roof vent may also be modified either via processing and/or through additional layers to also exhibit icephobic, or anti-iceing, properties, i.e., the surface of the vent does not allow the formation of ice on it, or at least substantially reduces the tendency to form ice. This can be desirable since it reduces the rate of corrosion of the metal core and reduces the probability of leaks. Under some conditions said super-hydrophobic surfaces will also exhibit icephobic effects, since water droplets, which form at the surface, have insufficient adhesion, and once frozen, get blown away even by very low winds speeds.

Pure sheet metal vents constitute a thermal leak compared to the actual roof. Thus, in another embodiment the goal of the multi-layer design is to attempt to match the thermal properties of surrounding roof, matching the heat conductivity of clay or concrete tiles thus achieving better thermal insulation.

In an embodiment a ceramic layer may be added to the metallic core structure of the predominantly shape-conform vent acting as a thermal barrier and thereby reducing the heat conductivity of the entire structure. Such an additional layer may typically be made from $Al_2O_3$ or Mullite, but other comparable ceramics known to those skilled in the art are obviously also possible. In an embodiment, the ceramic layer may be porous in order to increase thermal insulation.

In yet another embodiment of the disclosed invention, a relatively thin ceramic layer may be added to the top of the metallic plastic, or ceramic core of the predominantly shape-conform vent, which closely matches the appearance of the ceramic, clay or concrete tiles from which the roof is made thereby achieving almost complete camouflage.

In yet another embodiment of the disclosed invention, a rubber or rubber-like layer may in part be added to the underside of the metallic, plastic, or ceramic core of the shape-conform vent in order to enable better sealing against neighboring tile and reduce the chance for water leaks. The rubber or rubber-like layer may will also permit the achieve water tight installation despite mechanical tolerances, including slight bending, of the metal plastic or ceramic core.

In yet another embodiment of the disclosed invention the additional layer or layers may serve to reduce the tendency of the typically sheet-metal based core of the predominantly shape-conform vent to corrode.

In yet another embodiment of the disclosed invention the additional layer or layers may serve to produce electricity, i.e. be predominantly photo-voltaic.

In some embodiments only portions of the vent core are covered with one or more additional layers. In some embodiments predominantly portions of the vent core which are exposed to the outside, i.e., are exposed to rain, snow, and sunlight are covered with one or more additional layers.

Methods of Deposition and Surface Modification

As previously mentioned, the various layers are applied to the core material in some embodiments to the material of the core prior to forming the actual ventilation apparatus from it and in some embodiments after the vent has been built from the core material.

Various methods of achieving a multi-layered, predominantly shape-conform vent may be used, which ultimately determines the type of bond which is created between the core structure and the additional layers.

In some embodiments the layer or layers are created by a Physical Vapor Deposition (PVD) process in a vacuum chamber such as magnetron sputtering (either DC or RF), whereby a plasma is created (typically from Argon) which sputters the material to be deposited from a target and deposits the atoms on a substrate, in this case the roof vent or its raw material. One advantage of sputtering is that even thermally sensitive materials like plastics can be coated. Another possible PVD technique is electron beam evaporation, whereby a high power electron beam evaporates the material to be deposited and the vapor then coats the roof vent or its raw material.

In some embodiments the sputtering process may create alloy layers on the roof vent or its raw material by sputtering compound targets or by simultaneously sputtering from several targets, by reactive sputtering, or a combination thereof. Similarly, alloy layers can be created by electron beam evaporation simultaneously from several crucibles. One final sputtering process step may also be used to create a thin final layer that achieves a desired color of the roof vent. In some embodiments a sputtering process may also be used to modify the structure, roughness, or cleanness of the surface (i.e., a plasma etch) of the predominantly shape-conform vent or its raw material.

Both magnetron sputtering and electron beam evaporation, while relatively expensive, are ideally suited to create films with extraordinary properties and of materials with very high melting and evaporation temperatures, such as various ceramics or some metals.

In some implementations also a Chemical Vapor Deposition process (CVD) may be used to form layers on the predominantly shape-conform vent or its raw core material. In some embodiments this may be a Plasma-Enhanced Chemical Vapor Deposition (PECVD) process.

In some embodiments an additional layer or layers are created by an electrochemical process, including but not limited to electroplating (electrodeposition or electroforming), or electrolytic passivation (anodization). In some embodiments an additional layer or layers are created by an electro-physical process, including but not limited to electrospraying or modified forms of electrospinning.

In some embodiments the layer or layers are created by a thermal spray process, including variants thereof such a detonation spray coating (DSC) which is particularly well suited for uniform thick coatings of complex surfaces, and whereby in general a feedstock of material, often provided as a powder, is molten, and then accelerated by a gas stream, and then propelled onto the vent or its raw material to form the desired layer. Metallic, including alloys, or ceramic layers may be created on the vent by such a method. Also, PTFE layers may be created on predominantly shape-conform vent by this method. In some embodiments this is to be followed by a high-temperature curing process.

In some embodiments the layer or layers are created by a laser assisted surface coating process. In some such embodiments the layer or layers are created by laser surface alloying (LSA) whereby a thin layer at the surface of the metal core of the predominantly shape-conform vent is melted by a high power laser beam with the simultaneous addition of the desired alloying element, thereby changing the surface chemical composition of the metal core. In some other similar embodiments the layer or layers are created by laser cladding or laser beam hardfacing. Typically a beam from a high-power IR laser, again mostly Nd:YAG or $CO_2$ is scanned across the surface and the material, which is to be deposited, is simultaneously supplied as a powder via gas jet injection system to point where the laser hits the vent or its raw material. The laser then melts and fuses the powder and creates a uniform layer on the surface.

In some embodiments a quasi-layer or layers are created from the core material of the vent by using a Laser to modify the surface of said core material. Typically a beam from a pulsed high-power IR laser, mostly Nd:YAG or $CO_2$, is scanned across the surface and the core material is molten and then re-solidifies assuming different properties and or appearance.

In some embodiments the layer or layers are created by Plasma Transfer Arc process, whereby typically under atmospheric conditions a plasma is created—usually referred to as plasma transfer arc—between an electrode and the vent or its raw material, and simultaneously the material to be coated is supplied as a stream of powder which is molten and fused to the surface of the vent by the plasma. Since the material to be coated is part of an electric circuit, this embodiment is only applicable to vents with cores made from metal. Plasma Transfer Arc methods are specifically well suited for high throughput processing and relatively thick, dense and crack-free layers of several mm thickness can be produced, both from metal alloys and ceramics.

In some embodiments the layer or layers are created by a bonding process, which can be well suited for additional layers of increased thickness, for example of parts made from ceramics, the thickness of which may exceed the thickness of the core structure of the vent.

In some embodiments the layer or layers are created by gluing, which can also be well suited for additional layers of increased thickness, for example of parts made from ceramics, the thickness of which may exceed the thickness of the core structure of the vent. In one such embodiment the layer or layers are created by a laminating process.

In some embodiments the layer or layers are created by sol-gel process whereby from precursors, typically metal alkoxides, a colloidal solution (sol) of monomers is created, which acts as the precursor for an integrated network (gel) of either discrete particles or network polymers.

In some embodiments the layer or layers are created by layer-by-layer (LBL) assembly technique. For example, in some embodiments, on steel surfaces a first layer may be produced with an solution of Poly(diallyldimetylammonium) (PDDA) and or poly(sodium 4-styrenesulfonate) (PSS). Then, a subsequent layer may be produced using a suspension of Silica $SiO_2$ nanoparticles or $TiO_2$ nanoparticles. Typical particle sizes are of the order of several 10s of nm, frequently between 10 and 40 nm. A thermal step (baking) may follow in some embodiments. A further step may comprise using a methanolic solution of perfluorodecyltriethoxysilane (PTES), followed by another thermal step. In some embodiments pure $N_2$ or other suitable, cleaned and dry gasses or gas mixtures may be used for drying the surfaces.

In some embodiments the layer or layers are created by painting, spray painting, spin coating, dip coating, or in general a low temperature coating process.

In embodiments the layer or layers are created by dissolving one or more polymers with a solvent, for example methyl, ethyl, ketone, dimethyl formamid, totuol or others, and applying the solution to the surface of the predominantly shape-conform vent or to the raw material prior to forming a predominantly shape-conform vent, and letting the solution solidify. Additional components may be added to the solution. In some embodiments a layer can be created by spraying and by spin-coating a fluoropolymer incorporated with $SiO_2$ and or $TiO_2$ nanopowder onto the core structure.

In some embodiments the layer or layers are created by an atomized-spray-plasma deposition (ASPD) process, whereby an ultrasonic nozzle generates a mist of small droplets (typically around 20 μm to 30 μm in size). Subsequently, plasma-excited species (VUV, electrons, ions) initiate polymerization at the carbon-carbon double bond for the precursor molecules contained within the droplets in addition to activating the substrate surface. Polymer chain growth occurs already within the droplets, which ultimately leads to a stable layer, once deposited on the surface.

In some embodiments a solution of nanoparticles may be used for spray casting. For example, the nanoparticle solution may be composed of a mixture of ZnO nanoparticles, an organosilicon compound, specifically a organosilane quaternary nitrogen compound (acting as binder), and ethyl acetate. In some embodiments the mixture may be primarily composed of ethyl acetate (on the order of 80% or less by weight), on the order of 20% or less organosilane quaternary nitrogen compound. and correspondingly of only a few (single digit) percent of the ZnO nanoparticles. Thereby an effective dispersion of the nanoparticles in solution may be achieved. The solution may be sprayed onto the surface of the predominantly shape-conform vents using a double action airbrush for atomizing the spray and producing thin hydrophobic or even super-hydrophobic coatings.

In some embodiments this process may be conducted in a controlled atmosphere, for example, using filtered and/or pure gases, and/or under reduced gas pressure.

Although the invention has been disclosed in the context of certain embodiments and examples, it will be understood by those skilled in the art that the invention extends beyond the specifically disclosed embodiments to other alternative embodiments and/or uses and obvious modifications and equivalents thereof. Accordingly, the invention is not intended to be limited by the specific disclosures of preferred embodiments herein.

What is claimed is:

1. A ventilation apparatus comprising:
   at least one shape predominantly conforming in predominantly two dimensions to a structure of one or more components from which a wall or a roof of a building is made, wherein the two dimensions extend approximately parallel to a plane formed by the wall or the roof, and wherein the apparatus permits airflow into or out of the building predominantly through the plane formed by the wall or the roof;
   a predominantly metallic, plastic, or ceramic vent core; and
   at least one layer of material with chemically or physically substantially different properties than the core, such that at least one functional characteristic of the ventilation apparatus differs compared to another ventilation apparatus using only the vent core material;
   wherein the at least one layer is on the vent core and exhibits the property of being hydrophobic, super-hydrophobic, icephobic, anti-icing, or any combinations thereof; and
   wherein the at least one layer is selected from
   (i) a single type of nanoparticle deposited onto the vent core;
   (ii) a mix of different types of nanoparticles deposited onto the vent core; or
   (iii) a nanostructured surface created on the vent core.

2. The ventilation apparatus according to claim 1 wherein the at least one layer is produced by predominantly depositing polymers or polymer precursors.

3. The ventilation apparatus according to claim 1 wherein the at least one layer is produced by predominantly depositing at least one silicone or silicone precursor.

4. The ventilation apparatus according to claim 1 wherein the at least one layer is produced by predominantly depositing at least one synthetic fluoropolymer or its precursor.

5. The ventilation apparatus according to claim 1 wherein the at least one layer is produced on a raw material used to form the vent core prior to forming the vent core.

6. The ventilation apparatus according to claim 1 wherein the at least one layer is produced on the vent core after forming the vent core.

7. The ventilation apparatus according to claim 1 wherein the at least one layer is produced on the ventilation apparatus after it has been installed in a building.

8. The ventilation apparatus according to claim 1 wherein the at least one layer is directly on the vent core.

9. The ventilation apparatus according to claim 1 wherein the at least one layer is on the vent core, said layer having a substantially different thermal conductivity than the vent core.

10. The ventilation apparatus according to claim 9 wherein the at least one layer is produced on a raw material used to form the vent core prior to forming the vent core.

11. The ventilation apparatus according to claim 9 wherein the at least one layer is produced on the vent core after forming the vent core.

12. The ventilation apparatus according to claim 9 wherein the at least one layer is produced on the ventilation apparatus after it has been installed in a building.

13. The ventilation apparatus according to claim 1 wherein the at least one layer has a substantially different optical reflectivity than the vent core.

14. The ventilation apparatus according to claim 13 wherein the at least one layer is produced on a raw material used to form the vent core prior to forming the vent core.

15. The ventilation apparatus according to claim 13 wherein the at least one layer is produced on the vent core after forming the core vent.

16. The ventilation apparatus according to claim 13 wherein the at least one layer is produced on the ventilation apparatus after it has been installed in a building.

17. The ventilation apparatus according to claim 1 wherein the at least one layer is configured to mimic the visual appearance and surface texture of a surrounding wall or roof.

18. The ventilation apparatus according to claim 1 wherein the at least one layer is produced by a physical vapor deposition process.

19. The ventilation apparatus according to claim 1 wherein the at least one layer is produced by a process or technique selected from the group consisting of
(a) a chemical vapor deposition or plasma-enhanced chemical vapor deposition process;
(b) an electro-chemical process;
(c) a thermal spray process;
(d) a laser assisted surface coating process;
(e) a plasma transfer arc process;
(f) a bonding process;
(g) a sol-gel process;
(h) a layer-by-layer assembly technique;
(i) an atomized-spray-plasma deposition process; and
(j) a low temperature coating process of painting, spray painting, spin coating, or dip coating.

20. The ventilation apparatus according to claim 1 wherein the at least one layer is formed predominantly from metal.

21. The ventilation apparatus according to claim 1 wherein the at least one layer is formed predominantly from ceramic.

22. The ventilation apparatus according to claim 1 wherein the at least one layer is formed from predominantly one or more dissolved polymers.

23. The ventilation apparatus according to claim 1 wherein the at least one layer is formed by applying predominantly one or more polymer precursors and finishing polymerization thereafter.

24. The ventilation apparatus according to claim 1 wherein the at least one layer is formed by applying predominantly one or more silicones or silicone precursors.

25. The ventilation apparatus according to claim 1 wherein the at least one layer is formed by applying predominantly at least one synthetic fluoropolymer or its precursors.

26. The ventilation apparatus according to claim 1 wherein the at least one layer contains nanocomposite materials.

27. The ventilation apparatus according to claim 1 wherein the at least one layer is formed by a process selected from the group consisting of:
a) embedding at least one type of nanoparticle in a matrix material;
b) depositing predominantly metal oxide nanoparticles embedded in a predominantly polymer based matrix;
c) depositing predominantly metal oxide nanoparticles embedded in a predominantly acrylate polymer based matrix;
d) depositing predominantly metal oxide nanoparticles embedded in a predominantly silicone based matrix;
e) depositing predominantly metal oxide nanoparticles embedded in a predominantly synthetic fluoropolymer based matrix;
f) depositing predominantly carbon nanoparticles embedded in a predominantly polymer based matrix;
g) depositing predominantly carbon nanoparticles embedded in a predominantly acrylate polymer based matrix;
h) depositing predominantly carbon nanoparticles embedded in a predominantly silicone based matrix;
i) depositing predominantly carbon nanoparticles embedded in a predominantly synthetic fluoropolymer based matrix;
j) depositing predominantly naturally occurring nanoparticles embedded in a predominantly polymer based matrix;
k) depositing predominantly naturally occurring nanoparticles embedded in a predominantly acrylate polymer based matrix;
l) depositing predominantly naturally occurring nanoparticles embedded in a predominantly silicone based matrix;
m) depositing predominantly naturally occurring nanoparticles embedded in a predominantly synthetic fluoropolymer based matrix;
n) depositing predominantly metal nanoparticles embedded in a predominantly polymer based matrix;
o) depositing predominantly metal nanoparticles embedded in a predominantly acrylate polymer based matrix;
p) depositing predominantly metal nanoparticles embedded in a predominantly silicone based matrix;
q) depositing predominantly metal nanoparticles embedded in a predominantly synthetic fluoropolymer based matrix;
r) depositing a composite of a matrix and at least a single type of nanoparticles or a mix of different types of nanoparticles and wherein said nanoparticles are embedded into the matrix;
s) depositing predominantly at least one type of nanoparticle embedded in a matrix of predominantly polymers or polymer precursors;

t) depositing predominantly at least one type of nanoparticle embedded in a matrix of predominantly silicones or silicone precursors; and u) depositing predominantly at least one type of nanoparticle embedded in a matrix of predominantly synthetic fluoropolymers or synthetic fluoropolymer precursors.

28. A ventilation apparatus comprising:

at least one shape predominantly conforming in predominantly two dimensions to a structure of one or more components from which a wall or a roof of a building is made, wherein the two dimensions extend approximately parallel to a plane formed by the wall or the roof, and wherein the apparatus permits airflow into or out of the building predominantly through the plane formed by the wall or the roof;

a predominantly metallic, plastic, or ceramic vent core; and at least one layer of material with chemically or physically substantially different properties than the core, such that at least one functional characteristic of the ventilation apparatus differs compared to another ventilation apparatus using only the vent core material;

wherein the at least one layer is on the vent core and exhibits the property of being hydrophobic, superhydrophobic, icephobic, anti-icing, or any combinations thereof; and wherein the at least one layer contains nanocomposite materials.

29. The ventilation apparatus according to claim 28 wherein the at least one layer is selected from (i) a single type of nanoparticle deposited onto the vent core;

(ii) a mix of different types of nanoparticles deposited onto the vent core; or (iii) a nanostructured surface created on the vent core.

30. The ventilation apparatus according to claim 28 wherein the at least one layer is produced by predominantly depositing polymers or polymer precursors.

31. The ventilation apparatus according to claim 28 wherein the at least one layer is produced by predominantly depositing at least one silicone or silicone precursor.

32. The ventilation apparatus according to claim 28 wherein the at least one layer is produced by predominantly depositing at least one synthetic fluoropolymer or its precursor.

33. The ventilation apparatus according to claim 28 wherein the at least one layer is produced on a raw material used to form the vent core prior to forming the vent core.

34. The ventilation apparatus according to claim 28 wherein the at least one layer is produced on the vent core after forming the vent core.

35. The ventilation apparatus according to claim 28 wherein the at least one layer is produced on the ventilation apparatus after it has been installed in a building.

36. The ventilation apparatus according to claim 28 wherein the at least one layer is directly on the vent core.

37. The ventilation apparatus according to claim 28 wherein the at least one layer is on the vent core, said layer having a substantially different thermal conductivity than the vent core.

38. The ventilation apparatus according to claim 37 wherein the at least one layer is produced on a raw material used to form the vent core prior to forming the vent core.

39. The ventilation apparatus according to claim 37 wherein the at least one layer is produced on the vent core after forming the vent core.

40. The ventilation apparatus according to claim 37 wherein the at least one layer is produced on the ventilation apparatus after it has been installed in a building.

41. The ventilation apparatus according to claim 28 wherein the at least one layer has a substantially different optical reflectivity than the vent core.

42. The ventilation apparatus according to claim 41 wherein the at least one layer is produced on a raw material used to form the vent core prior to forming the vent core.

43. The ventilation apparatus according to claim 41 wherein the at least one layer is produced on the vent core after forming the core vent.

44. The ventilation apparatus according to claim 41 wherein the at least one layer is produced on the ventilation apparatus after it has been installed in a building.

45. The ventilation apparatus according to claim 28 wherein the at least one layer is configured to mimic the visual appearance and surface texture of a surrounding wall or roof.

46. The ventilation apparatus according to claim 28 wherein the at least one layer is produced by a physical vapor deposition process.

47. The ventilation apparatus according to claim 28 wherein the at least one layer is produced by a process or technique selected from the group consisting of (a) a chemical vapor deposition or plasma-enhanced chemical vapor deposition process;

(b) an electro-chemical process;

(c) a thermal spray process;

(d) a laser assisted surface coating process;

(e) a plasma transfer arc process;

(f) a bonding process;

(g) a sol-gel process;

(h) a layer-by-layer assembly technique;

(i) an atomized-spray-plasma deposition process; and (j) a low temperature coating process of painting, spray painting, spin coating, or dip coating.

48. The ventilation apparatus according to claim 28 wherein the at least one layer is formed predominantly from metal.

49. The ventilation apparatus according to claim 28 wherein the at least one layer is formed predominantly from ceramic.

50. The ventilation apparatus according to claim 28 wherein the at least one layer is formed from predominantly one or more dissolved polymers.

51. The ventilation apparatus according to claim 28 wherein the at least one layer is formed by applying predominantly one or more polymer precursors and finishing polymerization thereafter.

52. The ventilation apparatus according to claim 28 wherein the at least one layer is formed by applying predominantly one or more silicones or silicone precursors.

53. The ventilation apparatus according to claim 28 wherein the at least one layer is formed by applying predominantly at least one synthetic fluoropolymer or its precursors.

54. The ventilation apparatus according to claim 28 wherein the at least one layer is formed by a process selected from the group consisting of:

a) embedding at least one type of nanoparticle in a matrix material;

b) depositing predominantly metal oxide nanoparticles embedded in a predominantly polymer based matrix;

c) depositing predominantly metal oxide nanoparticles embedded in a predominantly acrylate polymer based matrix;

d) depositing predominantly metal oxide nanoparticles embedded in a predominantly silicone based matrix;
e) depositing predominantly metal oxide nanoparticles embedded in a predominantly synthetic fluoropolymer based matrix;
f) depositing predominantly carbon nanoparticles embedded in a predominantly polymer based matrix;
g) depositing predominantly carbon nanoparticles embedded in a predominantly acrylate polymer based matrix;
h) depositing predominantly carbon nanoparticles embedded in a predominantly silicone based matrix;
i) depositing predominantly carbon nanoparticles embedded in a predominantly synthetic fluoropolymer based matrix;
j) depositing predominantly naturally occurring nanoparticles embedded in a predominantly polymer based matrix;
k) depositing predominantly naturally occurring nanoparticles embedded in a predominantly acrylate polymer based matrix;
l) depositing predominantly naturally occurring nanoparticles embedded in a predominantly silicone based matrix;
m) depositing predominantly naturally occurring nanoparticles embedded in a predominantly synthetic fluoropolymer based matrix;
n) depositing predominantly metal nanoparticles embedded in a predominantly polymer based matrix;
o) depositing predominantly metal nanoparticles embedded in a predominantly acrylate polymer based matrix;
p) depositing predominantly metal nanoparticles embedded in a predominantly silicone based matrix;
q) depositing predominantly metal nanoparticles embedded in a predominantly synthetic fluoropolymer based matrix;
r) depositing a composite of a matrix and at least a single type of nanoparticles or a mix of different types of nanoparticles and wherein said nanoparticles are embedded into the matrix;
s) depositing predominantly at least one type of nanoparticle embedded in a matrix of predominantly polymers or polymer precursors;
t) depositing predominantly at least one type of nanoparticle embedded in a matrix of predominantly silicones or silicone precursors; and
u) depositing predominantly at least one type of nanoparticle embedded in a matrix of predominantly synthetic fluoropolymers or synthetic fluoropolymer precursors.

55. A ventilation apparatus comprising:
at least one shape predominantly conforming in predominantly two dimensions to a structure of one or more components from which a wall or a roof of a building is made, wherein the two dimensions extend approximately parallel to a plane formed by the wall or the roof, and wherein the apparatus permits airflow into or out of the building predominantly through the plane formed by the wall or the roof;
a predominantly metallic, plastic, or ceramic vent core; and
at least one layer of material with chemically or physically substantially different properties than the core, such that at least one functional characteristic of the ventilation apparatus differs compared to another ventilation apparatus using only the vent core material;
wherein the at least one layer is on the vent core and exhibits the property of being hydrophobic, super-hydrophobic, icephobic, anti-icing, or any combinations thereof; and
wherein the at least one layer is formed by a process selected from the group consisting of:
a) embedding at least one type of nanoparticle in a matrix material;
b) depositing predominantly metal oxide nanoparticles embedded in a predominantly polymer based matrix;
c) depositing predominantly metal oxide nanoparticles embedded in a predominantly acrylate polymer based matrix;
d) depositing predominantly metal oxide nanoparticles embedded in a predominantly silicone based matrix;
e) depositing predominantly metal oxide nanoparticles embedded in a predominantly synthetic fluoropolymer based matrix;
f) depositing predominantly carbon nanoparticles embedded in a predominantly polymer based matrix;
g) depositing predominantly carbon nanoparticles embedded in a predominantly acrylate polymer based matrix;
h) depositing predominantly carbon nanoparticles embedded in a predominantly silicone based matrix;
i) depositing predominantly carbon nanoparticles embedded in a predominantly synthetic fluoropolymer based matrix;
j) depositing predominantly naturally occurring nanoparticles embedded in a predominantly polymer based matrix;
k) depositing predominantly naturally occurring nanoparticles embedded in a predominantly acrylate polymer based matrix;
l) depositing predominantly naturally occurring nanoparticles embedded in a predominantly silicone based matrix;
m) depositing predominantly naturally occurring nanoparticles embedded in a predominantly synthetic fluoropolymer based matrix;
n) depositing predominantly metal nanoparticles embedded in a predominantly polymer based matrix;
o) depositing predominantly metal nanoparticles embedded in a predominantly acrylate polymer based matrix;
p) depositing predominantly metal nanoparticles embedded in a predominantly silicone based matrix;
q) depositing predominantly metal nanoparticles embedded in a predominantly synthetic fluoropolymer based matrix;
r) depositing a composite of a matrix and at least a single type of nanoparticles or a mix of different types of nanoparticles and wherein said nanoparticles are embedded into the matrix;
s) depositing predominantly the at least one type of nanoparticle embedded in a matrix of predominantly polymers or polymer precursors; and
t) depositing predominantly at least one type of nanoparticle embedded in a matrix of predominantly synthetic fluoropolymers or synthetic fluoropolymer precursors.

56. The ventilation apparatus according to claim 55 wherein the at least one layer is produced by predominantly depositing polymers or polymer precursors.

57. The ventilation apparatus according to claim 55 wherein the at least one layer is produced by predominantly depositing at least one silicone or silicone precursor.

58. The ventilation apparatus according to claim 55 wherein the at least one layer is produced by predominantly depositing at least one synthetic fluoropolymer or its precursor.

59. The ventilation apparatus according to claim 55 wherein the at least one layer is produced on a raw material used to form the vent core prior to forming the vent core.

60. The ventilation apparatus according to claim 55 wherein the at least one layer is produced on the vent core after forming the vent core.

61. The ventilation apparatus according to claim 55 wherein the at least one layer is produced on the ventilation apparatus after it has been installed in a building.

62. The ventilation apparatus according to claim 55 wherein the at least one layer is directly on the vent core.

63. The ventilation apparatus according to claim 55 wherein the at least one layer is on the vent core, said layer having a substantially different thermal conductivity than the vent core.

64. The ventilation apparatus according to claim 63 wherein the at least one layer is produced on a raw material used to form the vent core prior to forming the vent core.

65. The ventilation apparatus according to claim 63 wherein the at least one layer is produced on the vent core after forming the vent core.

66. The ventilation apparatus according to claim 63 wherein the at least one layer is produced on the ventilation apparatus after it has been installed in a building.

67. The ventilation apparatus according to claim 55 wherein the at least one layer has a substantially different optical reflectivity than the vent core.

68. The ventilation apparatus according to claim 67 wherein the at least one layer is produced on a raw material used to form the vent core prior to forming the vent core.

69. The ventilation apparatus according to claim 67 wherein the at least one layer is produced on the vent core after forming the core vent.

70. The ventilation apparatus according to claim 67 wherein the at least one layer is produced on the ventilation apparatus after it has been installed in a building.

71. The ventilation apparatus according to claim 55 wherein the at least one layer is configured to mimic the visual appearance and surface texture of a surrounding wall or roof.

72. The ventilation apparatus according to claim 55 wherein the at least one layer is produced by a physical vapor deposition process.

73. The ventilation apparatus according to claim 55 wherein the at least one layer is produced by a process or technique selected from the group consisting of
  (a) a chemical vapor deposition or plasma-enhanced chemical vapor deposition process;
  (b) an electro-chemical process;
  (c) a thermal spray process;
  (d) a laser assisted surface coating process;
  (e) a plasma transfer arc process;
  (f) a bonding process;
  (g) a sol-gel process;
  (h) a layer-by-layer assembly technique;
  (i) an atomized-spray-plasma deposition process; and
  (j) a low temperature coating process of painting, spray painting, spin coating, or dip coating.

74. The ventilation apparatus according to claim 55 wherein the at least one layer is formed predominantly from metal.

75. The ventilation apparatus according to claim 55 wherein the at least one layer is formed predominantly from ceramic.

76. The ventilation apparatus according to claim 55 wherein the at least one layer is formed from predominantly one or more dissolved polymers.

77. The ventilation apparatus according to claim 55 wherein the at least one layer is formed by applying predominantly one or more polymer precursors and finishing polymerization thereafter.

78. The ventilation apparatus according to claim 55 wherein the at least one layer is formed by applying predominantly one or more silicones or silicone precursors.

79. The ventilation apparatus according to claim 55 wherein the at least one layer is formed by applying predominantly at least one synthetic fluoropolymer or its precursors.

80. The ventilation apparatus according to claim 55 wherein the at least one layer contains nanocomposite materials.

* * * * *

UNITED STATES PATENT AND TRADEMARK OFFICE
CERTIFICATE OF CORRECTION

PATENT NO. : 10,487,513 B2
APPLICATION NO. : 14/717794
DATED : November 26, 2019
INVENTOR(S) : Andreas Hieke Page 1 of 1

It is certified that error appears in the above-identified patent and that said Letters Patent is hereby corrected as shown below:

In the Specification

In Column 6, Line 9, delete "oder" and insert --or--.

In Column 7, Line 4, delete "anti-iceing," and insert --anti-icing,--.

In Column 9, Lines 38-39, delete "(diallyldimetylammonium)" and insert --(diallyldimethylammonium)--.

In Column 9, Line 55, delete "formamid, totuol" and insert --formamide, toluol--.

In Column 10, Line 14, delete "compound." and insert --compound--.

Signed and Sealed this
Twenty-fourth Day of March, 2020

Andrei Iancu
*Director of the United States Patent and Trademark Office*